United States Patent [19]

Evans et al.

[11] Patent Number: 5,118,584

[45] Date of Patent: Jun. 2, 1992

[54] METHOD OF PRODUCING MICROBUMP CIRCUITS FOR FLIP CHIP MOUNTING

[75] Inventors: Mark D. Evans, Rochester; John R. Debesis, Penfield; Wesley H. Bacon, Rochester, all of N.Y.

[73] Assignee: Eastman Kodak Company, Rochester, N.Y.

[21] Appl. No.: 531,736

[22] Filed: Jun. 1, 1990

[51] Int. Cl.⁵ .................... G03F 7/00; G03C 5/58
[52] U.S. Cl. ...................... 430/313; 430/318; 430/329; 156/643; 156/650; 427/96; 427/259
[58] Field of Search ........... 430/314, 316, 318, 319, 430/313, 329; 156/643, 650; 427/96, 259, 272, 282

[56] References Cited

U.S. PATENT DOCUMENTS

| | | | |
|---|---|---|---|
| 3,465,211 | 9/1969 | Adams | 317/234 |
| 3,625,837 | 12/1971 | Nelson et al. | 204/15 |
| 3,809,625 | 5/1974 | Brown et al. | 204/15 |
| 3,893,229 | 7/1975 | Aird | 29/589 |
| 4,042,954 | 8/1977 | Harris | 357/71 |
| 4,087,314 | 5/1978 | George et al. | 156/643 |
| 4,272,561 | 6/1981 | Rothman et al. | 430/314 |
| 4,293,624 | 10/1981 | Buckley | 430/314 |
| 4,353,935 | 10/1982 | Symersky | 427/87 |
| 4,382,977 | 5/1983 | Murphy et al. | 427/42 |
| 4,417,387 | 11/1983 | Heslop | 29/591 |
| 4,600,600 | 7/1986 | Pammer et al. | 427/89 |
| 4,749,120 | 6/1988 | Hatada | 228/123 |
| 4,789,647 | 12/1988 | Peters | 437/190 |
| 4,820,013 | 4/1989 | Fuse | 350/96.27 |
| 4,880,708 | 11/1989 | Sharma et al. | 428/620 |

FOREIGN PATENT DOCUMENTS 58-28858 2/1983 Japan .

Primary Examiner—Marion E. McCamish
Assistant Examiner—Kathleen Duda
Attorney, Agent, or Firm—Dennis R. Arndt

[57] ABSTRACT

In a microbump flip-chip mounting method, microcircuit features such as conductors and microbumps are formed by a lift off process. A first refractory metal is employed to promote adhesion between a layer of aluminum deposited by physical vapor deposition and a second refractory metal is employed to promote adhesion between the aluminum and an overlying layer of gold.

8 Claims, 4 Drawing Sheets

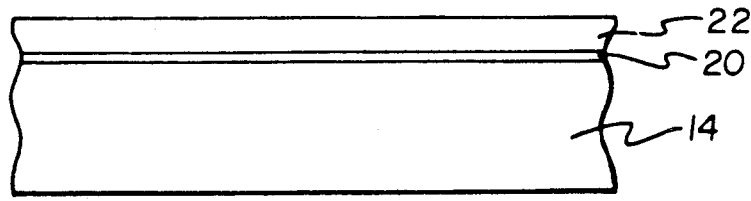
FIG. IA
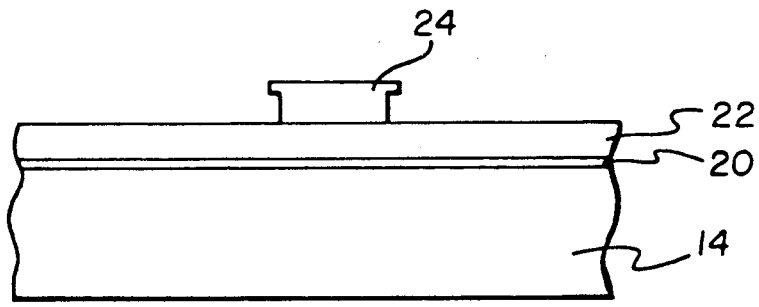
FIG. IB
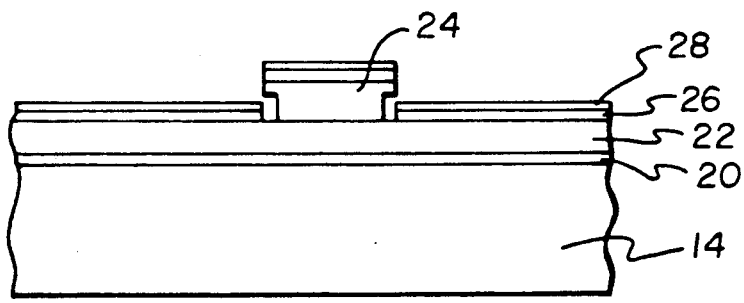
FIG. IC
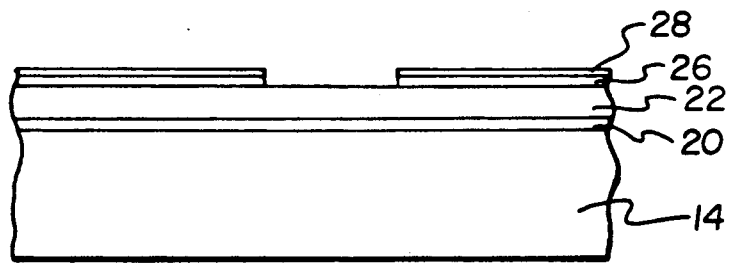
FIG. ID
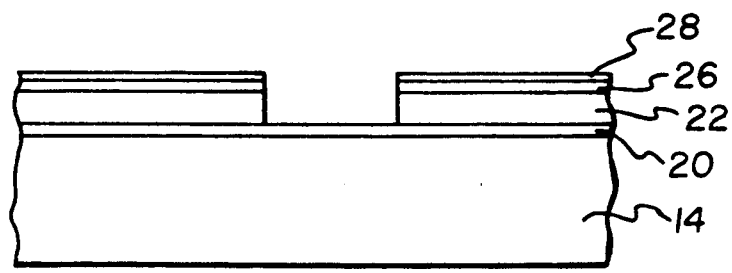
FIG. IE

METHOD OF PRODUCING MICROBUMP CIRCUITS FOR FLIP CHIP MOUNTING

TECHNICAL FIELD

The present invention relates to a method of producing microcircuit features for connecting simiconductor devices to microcircuit patterns employing flip-chip mounting.

BACKGROUND ART

In flip-chip device mounting methods, small metal projections, or microbumps, are provided on the electrode contacts of a semiconductor device, or on a circuit to which the device is to be connected. The semiconductor device is aligned with the conductor pattern on the circuit and is fixed to the circuit by soldering or by a curable resin adhesive. See for example U.S. Pat. No. 4,749,120 issued Jun. 7, 1988 to Hatada.

In one type of apparatus, an LED (light emitting diode) print head is mounted on a glass substrate having a photographic mask, by the flip-chip mounting technique. See U.S. Pat. application Ser. No. 375,154 by Contois et al. now U.S. Pat. No. 4,980,701. The glass substrate may also incorporate a lens array, such as a sel-foc lens for the LED print head. The flip-chip mounting method permits precise registration of the surface of the LED die with respect to such a lens array.

It is desirable that the circuit conductors be as thick as practical for low-resistance, high-frequency operation.

It is also desirable that the microbumps be deformable to allow for slight variations in height, and microcircuit flatness during bonding operations. Etched aluminum patterned with a photoresist mask has been traditionally employed as a conductor for the circuits employed in flip-chip mounting and solder bumps have been used for the microbumps. A problem with formation of aluminum conductors by patterning with photoresist is that the film thickness is limited due to the durability of the resist. A further problem is that the solder bumps are not as soft or ductile as would be desirable for compensating for the differences in feature height by deformation of the bumps.

SUMMARY OF THE INVENTION

It is therefore the object of the present invention to provide an improved method of forming microcircuit conductors and microbumps for connecting semiconductor devices to circuits by means of the filp-chip mounting process.

The object of the invention is achieved by forming a microcircuit on a dielectric substrate by depositing by physical vapor deposition a layer of a first refractory metal on the substrate, and depositing by physical vapor deposition a layer of aluminum over the layer of first refractory metal. A lift off pattern of a positive photoresist is formed on the layer of aluminum by photolithography, and a layer of second refractory metal is deposited by physical vapor deposition over the pattern of positive photoresist. A layer of gold is then deposited by physical vapor deposition over the second refractory metal. The pattern of photoresist and overlying layers of second refractory metal and gold are removed to expose the underlying aluminum. The aluminum is removed by etching, employing the remaining gold as an etch mask, to expose the underlying refractory metal. The exposed first layer of refractory metal is then removed by etching employing the remaining gold as an etch mask. The process may be employed to form thick aluminum conductors or microbumps on a semiconductor device or a circuit substrate.

BRIEF DESCRIPTION OF THE DRAWINGS

FIG. 1A-F shows a method of making conductor patterns according to the present invention;

MODES OF CARRYING OUT THE INVENTION

Figure 2:
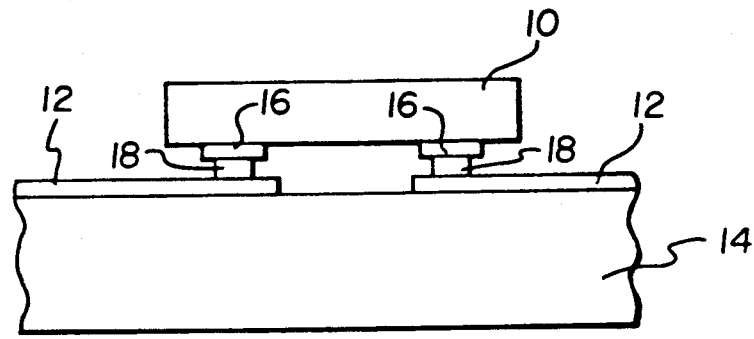
FIG. 2 is a schematic diagram showing a conventional flip-chip mounting of a semiconductor device on a substrate.

Referring first to FIG. 2, a semiconductor device is shown connected to a circuit 12 on a dielectric substrate 14 by the process of flip-chip mounting. The bonding pads 16 of the semiconductor device are connected to the circuit 12 via microbumps 18. The microbumps 18 may be originally formed on the circuit or on the semiconductor device, as is known in the prior art. The circuit is completed by aligning the microbumps with the circuit features and bonding the device to the substrate under pressure employing a curable adhesive.

Referring to FIG. 1 the method of producing a thick conductor 12 suitable for high frequency operation will now be described. As shown in FIG. 1A, after a conventional cleaning operation (not shown) comprising a solvent bath and ultraviolet light and ozone treatment for 15 minutes, a dielectric substrate 14 is covered with a layer of first refractory metal 20 followed by a layer of aluminum 22 1-10 $\mu$m thick. The dielectric substrate 14 may comprise for example glass, ceramic, resin, a semiconductor wafer coated with a dielectric such as silicon dioxide, or metal coated with a metal oxide or the like. The refractory metal 20 may comprise chrome, titanium or the like (preferably chrome 0.025 $\mu$m thick). The layers of refractory metal and aluminum are applied by a process of physical vapor depositions such as evaporation, sputtering, or combinations of these two processes (preferably electron beam evaporation). The first refractory metal forms an oxide bond with the substrate 14 during the process of physical vapor deposition. When the aluminum 22 is deposited following the deposition of the first refractory metal, a strong bond is also formed with the aluminum.

Next, a shown in FIG. 1B, a lift off mask 24 is formed employing a positive photoresist of the type which when developed appropriately produces a nail-head configuration. The term nail-head is used in the art to refer to the slight overhang produced at the top of the photoresist pattern which facilitates the lift off process. Photoresists of this type are well known for performing lift off in microcircuit formation and include the novalac family of phenolic resins. Preferably HPR 1182 photoresist from the Hunt Chemical Co. The photoresist is applied by spinning at 4000 RPM to produce a 1.3 $\mu$m coating. The coating is baked at 110° C. for 30 minutes exposed in hard contact with a mask. The photoresist pattern is developed for 30 seconds while being agitated at 30 cycles per minute.

The developer employed was Waycoat ® LSI Positive Photoresist Developer diluted 4 to 1 with water, purchased from Olin Hunt Specialty Products Inc., West Paterson, N.J.

As shown in FIG. 1c, a layer of a second refractory metal 26 (preferably titanium 0.025 μm thick if the first layer is chrome) is deposited over the structure by physical vapor deposition followed by a layer of gold 0.1 to 1.0 μm thick. The layer of titanium 26 produces a good adhesion bond between the aluminum 22 and the gold 28. As shown in FIG. 1D, the photoresist is next removed for example by emersion in a bath of hot acetone at 65° C. accompanied by ultrasonic agitation to remove the gold layer and expose the underlying aluminum 22.

Next, as shown in FIG. 1E, the exposed aluminum is removed by etching employing the remaining gold as an etch mask. A suitable etchant is a solution of 16 parts phosphoric acid, 1 part acetic acid, 1 part nitric acid, and 2 parts deionized water.

Figure 1F:
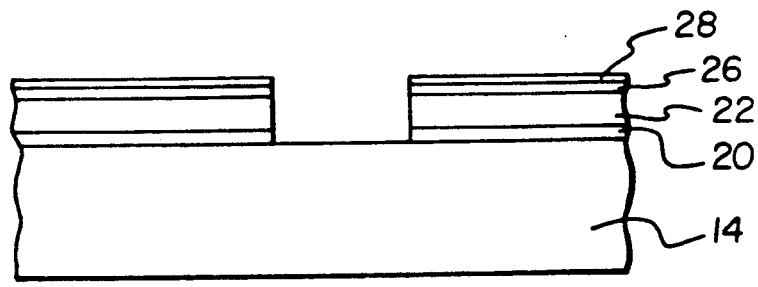

Finally, as shown in FIG. 1f, the exposed chrome layer 20 is removed by etching, employing the remaining gold layer 28 as an etch mask. A suitable etchant is a perchloric acid containing cerium commercially available as etchant #5913 from GFS Chemicals, Columbus, Ohio. The process of the present invention results in a microcircuit that is advantageous over the circuits of the prior art. By using the gold as an etch mask, the thickness of the aluminum can be much greater than with the prior art photoresist mask thereby resulting in a circuit having excellent high frequency response.

The process is capable of producing circuit patterns with circuit runs 10 μm wide on 20 μm centers with a thickness uniformity of better than 10%. The thickness of the aluminum and gold layers are readily varied within their ranges to meet circuit performance requirements.

The production of a circuit having ductile microbumps on a circuit pattern according to the present invention will now be described with reference to FIG. 3.

Figure 3A:
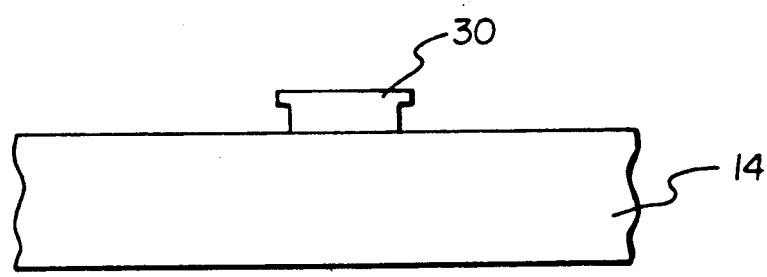
FIG. 3A-I shows the process for forming a conductor pattern and ductile microbumps on the conductor pattern employed according to the method of the present invention.
Figure 3B:
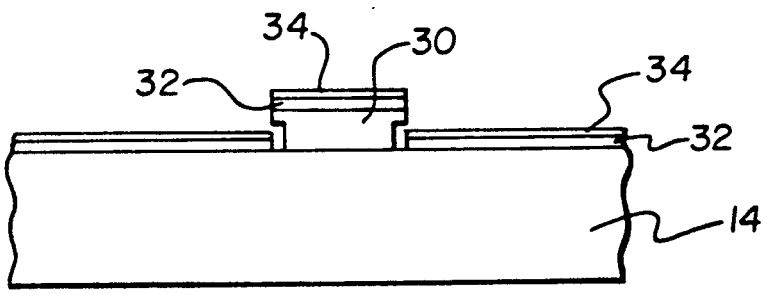
Figure 3C:
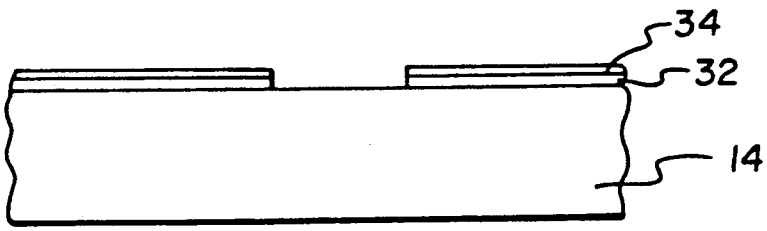

Referring to FIG. 3A, after the standard cleaning step described above, not shown, a positive photoresist lift off pattern 30 is formed on the dielectric substrate 14. The photoresist pattern is formed as described above using a positive photoresist such as the novalac photoresist employed above, and processed to form a nail-head pattern for lift off processing. Next, as shown in FIG. 3B, a layer of a first refractory metal 32 (preferably titanium 0.03 μm thick) is deposited by physical vapor deposition on the substrate, followed by a layer of gold 34 (0.1 to 2 μm thick, preferably 0.4 μm thick). The refractory metal provides a strong oxide bond between the substrate and the gold wiring pattern. Next, the photoresist pattern is removed, lifting off the overlying gold to leave the desired gold wiring pattern 34 on the substrate 14 as shown in FIG. 3c. The lift off is achieved by placing the substrate in hot acetone (preferably 65° C.) and ultrasonically agitating.

Figure 3D:
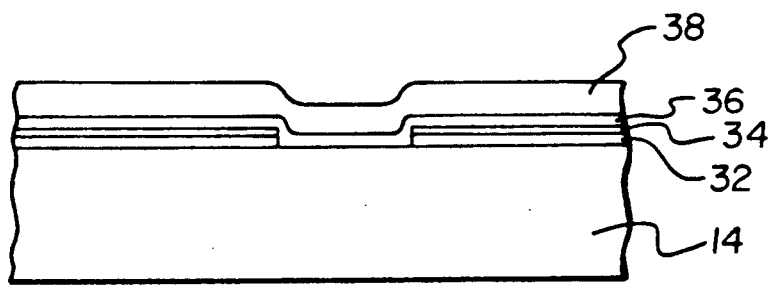

The ductile microbumps according to the present invention are then produced on the desired portions of the resulting gold circuit pattern by the following sequence of steps. After another standard cleaning (not shown) a layer of a second refractory metal 36 (preferably chrome 0.03 μm thick) is deposited over the substrate by physical vapor deposition, followed by a layer of aluminum 38 1-10 μm thick, preferably 3 μm thick. The resulting structure is shown in FIG. 3D. The chrome promotes adhesion between the aluminum 38 and underlying gold circuit pattern 34.

Figure 3E:
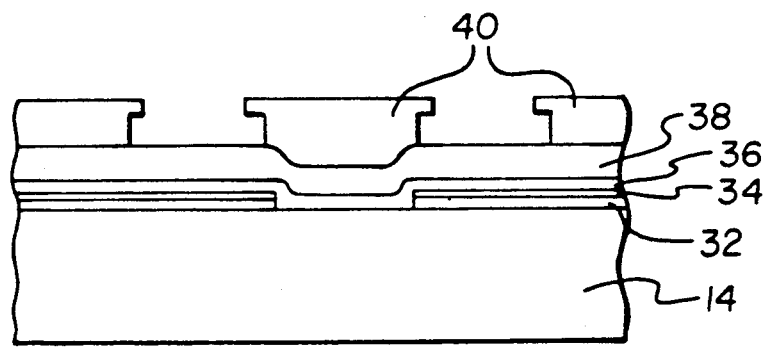
Figure 3F:
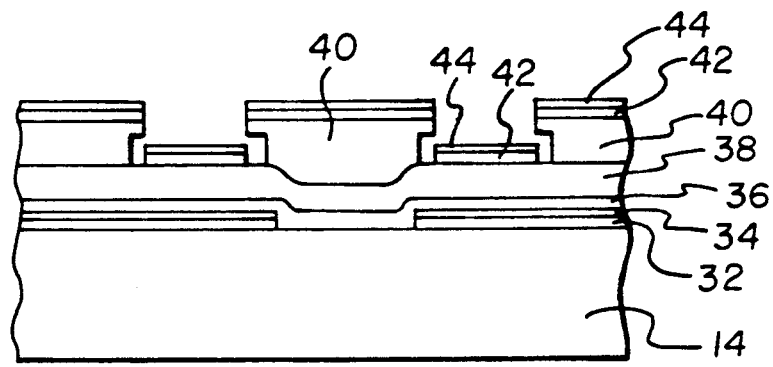

Next, as shown in FIG. 3E, a lift off pattern 40 of positive photoresist is formed by photolithography with openings in regions where the microbumps will be formed. A layer of refractory metal 42 (preferably titanium 0.03 μm thick) is deposited by physical vapor deposition, followed by a layer of gold 0.20 μm thick. The resulting structure is shown in FIG. 3F.

Figure 3G:
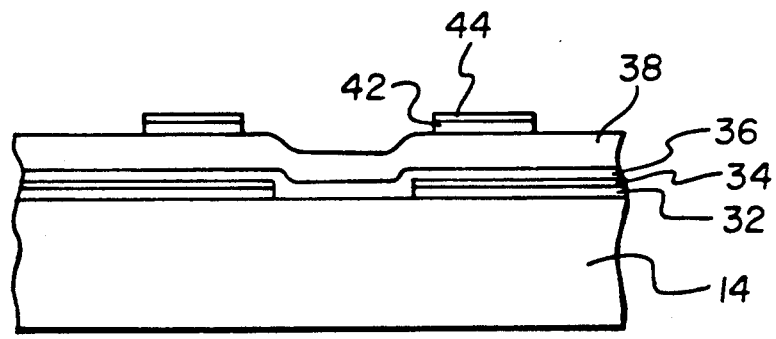
Figure 3H:
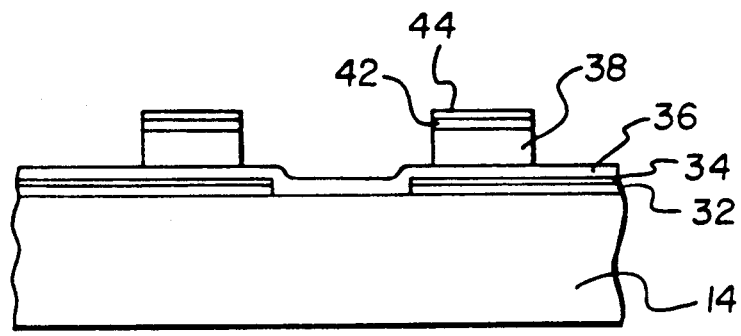

The photoresist pattern is then removed, for example in hot acetone with ultrasonic agitation, resulting in the structure shown in FIG. 3G. The gold 44 remaining on the surface is now employed as the etch mask for the microbumps. The exposed aluminum 38 is removed by etching, for example, with an etchant solution containing 16 parts phosphoric acid, 1 part acetic acid, 1 part nitric acid and 2 parts deionized water applied at 40° C. The resulting structure is shown in FIG. 3H.

Figure 3I:
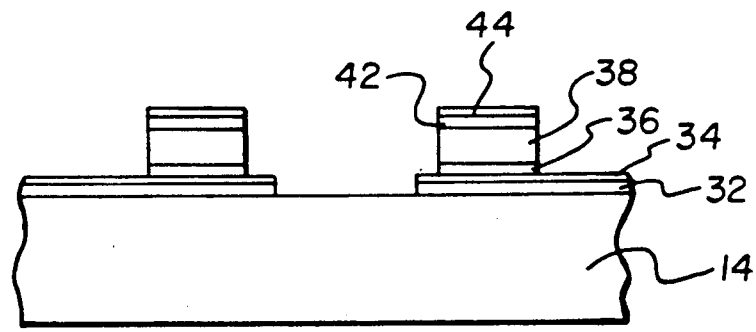

Finally, as shown in FIG. 3I, the exposed chrome is removed with the acerium containing perchloric acid etch noted above. The result is a .4 μm thick gold wiring pattern 34 with 3 to 3.5 micron high microbumps. The microbumps have excellent ductility for flip-chip mounting. Since the aluminum is very soft, a very thin layer of gold can be used, thereby resulting in materials cost reductions.

The same process can be employed to place the microbumps on a semiconductor device or microcircuit that is to be mounted to the substrate. Although a preferred example of the first and second refractory metals has been described as titanium and chrome, it will be understood that they could be reversed, using chrome to promote adhesion of the gold to the substrate and titanium to promote adhesion of the aluminum to the gold. In this case, an etchant for the titanium would be prepared and used. The preferred order was chosen due to the ready commercial availability of the chrome etchant.

Industrial Applicability and Advantages

The circuit conductors and microbumps according to the present invention are useful in flip-chip mounting of semiconductor components on a circuit. The circuit features produced by the present method are advantageous in that the thickness of the conductors is greater and ductility of the microbumps is superior to that of the prior art.

We claim:

1. A method of forming a microcircuit feature on a dielectric substrate; comprising the steps of:
    a. depositing by physical vapor deposition, a layer of a first refractory metal on the substrate;
    b. depositing by physical vapor deposition, a layer of aluminum over the first refractory metal layer;
    c. forming by photolithography, a lift off pattern of positive photoresist on the aluminum layer wherein selected areas of the aluminum layer are covered by the photoresist and nonselected areas of the aluminum layer are not covered by the photoresist;
    d. depositing by physical vapor deposition, a layer of second refractory metal over the pattern of photoresist wherein the second refractory metal covers the non-selected areas of the aluminum layer;
    e. depositing by physical vapor deposition, a layer of gold over the second refractory metal layer;
    f. lifting off the pattern of photoresist and the portion of the gold and second refractory metal layers overlying the pattern of photoresist to expose the selected areas of the aluminum layer;

g. removing by etching the exposed selected areas of the aluminum layer employing the remaining portion of the gold layer as an etch mask, to expose the portion of the first refractory metal layer underlaying the selected areas of the aluminum layer; and h. removing by etching the exposed portion of the first refractory metal layer empolying the remaining portions of the gold layer as an etch mask.

2. The method claimed in claim 1, wherein the first refractory metal includes chromium, and the second refractory metal is titanium.

3. The method claimed in claim 1, wherein the photoresist is a novolac resin, and the step of lifting off comprises immersing the substrate in hot acetone and agitating with ultrasonic vibration.

4. The method claimed in claim 1, wherein the aluminum layer is 1-10 $\mu$m thick and the gold layer 0.1-1.5 $\mu$m thick.

5. The method claimed in claim 1, wherein the microcircuit feature is a conductor pattern.

6. The method claimed in claim 1, wherein the microcircuit feature is a microbump for making electrical contact in a flip-chip mounting process.

7. The method claimed in claim 6, wherein the microcircuit feature is formed on a gold conductor pattern formed on the substrate by the steps of:

a. forming by photolithography a lift off pattern of positive photoresist on the substrate;

b. depositing by physical vapor deposition a layer of said second refractory metal over said photoresist pattern;

c. depositing by physical vapor deposition, a layer of gold over said second refractory metal layer; and d. lifting off the photoresist with the overlying gold and second refractory metal layers to leave the gold conductor pattern.

8. The method claimed in claim 7, wherein said second refractory metal layer is titanium which is 0.03 $\mu$m thick and said gold layer is 0.4 $\mu$m thick.

* * * * *